United States Patent
Shen et al.

(10) Patent No.: US 10,554,216 B2
(45) Date of Patent: Feb. 4, 2020

(54) CURRENT STEERING STRUCTURE WITH IMPROVED LINEARITY

(71) Applicant: SYNAPTICS INCORPORATED, San Jose, CA (US)

(72) Inventors: Dan Shen, Irvine, CA (US); Lorenzo Crespi, Costa Mesa, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 15/995,034

(22) Filed: May 31, 2018

(65) Prior Publication Data
US 2019/0372580 A1    Dec. 5, 2019

(51) Int. Cl.
| | |
|---|---|
| H03M 1/08 | (2006.01) |
| H03F 3/185 | (2006.01) |
| H03M 1/74 | (2006.01) |
| H03M 1/10 | (2006.01) |
| H03K 17/0416 | (2006.01) |
| H03M 1/06 | (2006.01) |

(52) U.S. Cl.
CPC .......... *H03M 1/0863* (2013.01); *H03F 3/185* (2013.01); *H03K 17/04163* (2013.01); *H03M 1/068* (2013.01); *H03M 1/1023* (2013.01); *H03M 1/745* (2013.01)

(58) Field of Classification Search
USPC ....................................................... 341/136
See application file for complete search history.

(56) References Cited

U.S. PATENT DOCUMENTS

| | | | | |
|---|---|---|---|---|
| 5,548,238 | A * | 8/1996 | Zhang | H03K 17/04106 327/374 |
| 8,947,282 | B1 * | 2/2015 | Fuks | H03M 1/68 341/153 |
| 9,806,729 | B1 * | 10/2017 | Razzaghi | H03M 1/0612 |
| 9,806,730 | B1 * | 10/2017 | Dusad | H03M 1/08 |
| 2016/0126973 | A1 * | 5/2016 | Mitani | H03M 1/0656 341/143 |
| 2017/0077936 | A1 * | 3/2017 | Kao | H03M 1/06 |

* cited by examiner

*Primary Examiner* — Howard Williams
(74) *Attorney, Agent, or Firm* — Haynes and Boone, LLP

(57) ABSTRACT

Systems and methods are provided for improved linearity of audio amplifiers. In one example, a system includes a first current source configured to provide a first current signal having a first current source output capacitance, and a second current source configured to provide a second current signal having a second current source output capacitance, where the first and second current source output capacitances are a different value. The system further includes a first capacitor compensation device coupled to an output of the first current source configured to provide a capacitance value to compensate for the second current source output capacitance, and a second capacitor compensation device coupled to an output of the second current source configured to provide a capacitance value to compensate for the first current source output capacitance. The system further includes a plurality of switches configured to switch the first and second current signals.

20 Claims, 3 Drawing Sheets

CURRENT STEERING STRUCTURE WITH IMPROVED LINEARITY

TECHNICAL FIELD

The present disclosure, in accordance with one or more embodiments, relates generally to processing audio signals and, more particularly for example, to improving signal linearity within high performance audio amplifiers.

BACKGROUND

Many modern devices such as laptop computers, computer tablets, MP3 players, and smart phones provide high fidelity audio signals for internal or external speaker connectivity. Such systems may generate audio content digitally, convert the digital signal to an analog signal, amplify the analog signal, and deliver an amplified analog signal to an audio transducer. In some high fidelity systems, a digital-to-analog converter includes a current steering structure to provide for improved performance. In order to maintain high performance, the current steering structure of the digital-to-analog converter utilizes a plurality of current cells corresponding to the number of bits of the digital input signal. Each current cell includes two current sources that provide a differential current output signal to an amplifier for signal amplification and further signal processing. Output capacitance signals associated with each of the two current sources differential current output signals may not match. Significantly, unwanted signal distortion and noise may be introduced in the differential current output signals due to the unmatched output capacitance signals, resulting in decreased linearity of the amplified audio signal provided to a speaker and/or a headphone. Thus, a user may be subject to a less enjoyable experience using the device. In view of the foregoing, there remains a need in the art for improved current steering structures that provide for improved audio signal linearity.

SUMMARY

The present disclosure provides systems and methods that address a need in the art for improved signal linearity for audio amplifiers used in modern devices, such as modern devices that incorporate speaker connectivity.

In various embodiments, a current cell includes a first current source operable to provide a first current signal, the first current source having a first current source output capacitance value, a second current source configured to provide a second current signal, the second current source having a second current source output capacitance value different from the first current source output capacitance value, a plurality of switches coupled between the first and second current sources configured to switch the first and second current signals, and a first capacitor compensation device coupled to an output of the first current source configured to provide a capacitance value to compensate for the second current source output capacitance, and a second capacitor compensation device coupled to an output of the second current source configured to provide a capacitance value to compensate for the first current source output capacitance, wherein a sum of the first current source output capacitance and the capacitance provided by the first capacitor compensation device is approximately equal to a sum of the second current source output capacitance and the capacitance provided by the second capacitor compensation device.

In various embodiments, a method includes generating a first current signal from a first current source, the first current source having a first current source output capacitance, generating a second current signal from a second current source, the second current source having a second current source output capacitance, compensating for the first current source output capacitance using a second capacitor compensation device coupled to an output of the second current source, compensating for the second current source output capacitance using a first capacitor compensation device coupled to an output of the first current source, wherein a sum of the first current source output capacitance and the first capacitor compensation device is approximately equal to a sum of the second current source output capacitance and the second capacitor compensation device, and selectively switching a plurality of switches to provide the first current signal and the second current signal at complementary inputs of an amplifier circuit.

The scope of the present disclosure is defined by the claims, which are incorporated into this section by reference. A more complete understanding of the present disclosure will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, where showings therein are for purposes of illustrating embodiments of the present disclosure and not for purposes of limiting the same. The components in the drawings are not necessarily to scale, emphasis instead being placed upon clearly illustrating the principles of the present disclosure.

DETAILED DESCRIPTION

The present disclosure describes systems and methods that address a need in the art to improve linearity of a current steering structure used in an audio amplifier to maintain high performance in modern devices that incorporate internal and external speaker amplifier functionality. The following discussion will be directed to a digital-to-analog converter (DAC) embodiment. But it will be appreciated that the current steering structure disclosed herein may be implemented in other type of data converter circuits such as, for example, an analog-to-digital converter (ADC).

Figure 1:
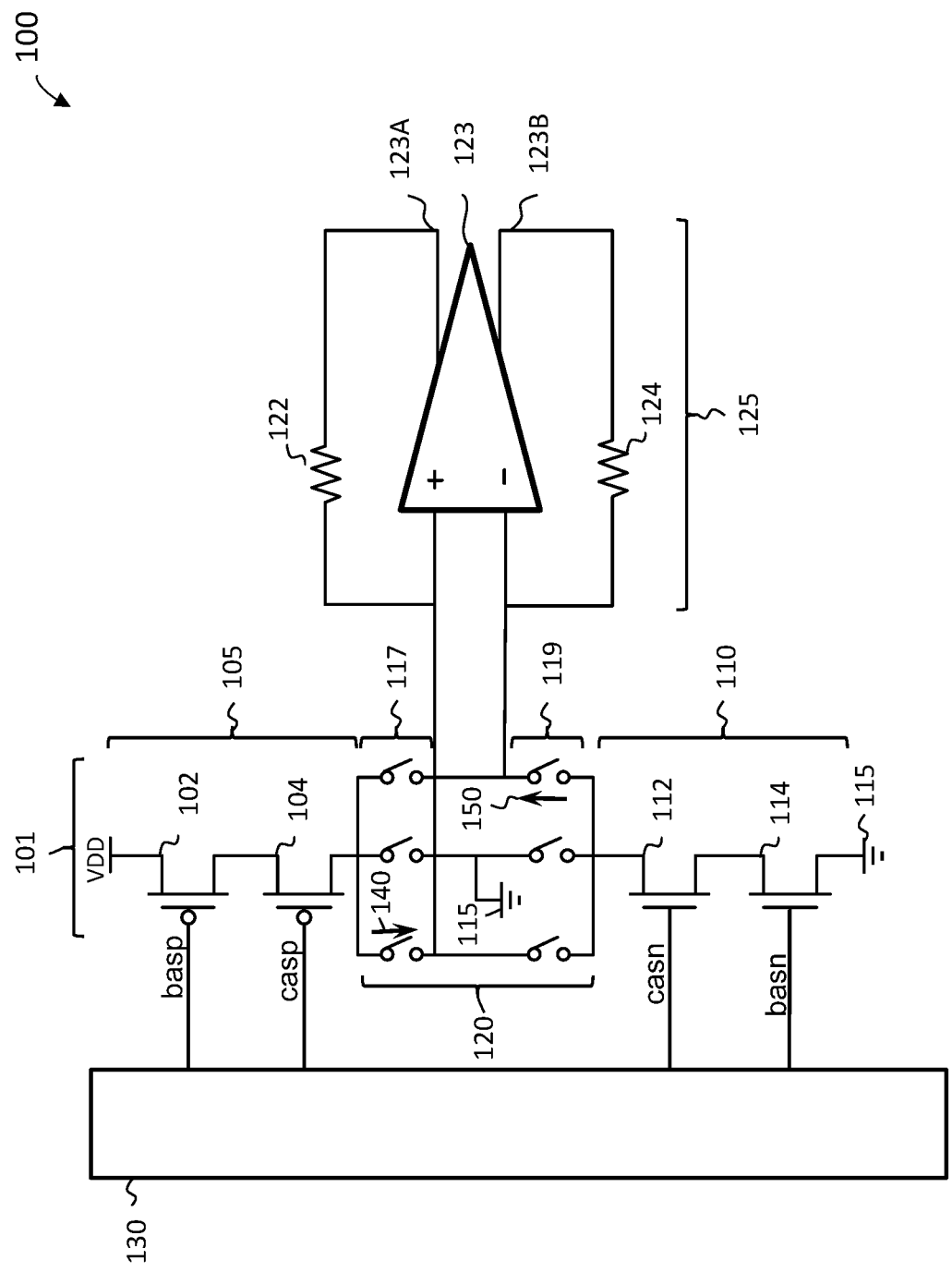
FIG. 1 illustrates a schematic diagram of a current steering structure.

For example, a current steering structure 100 is shown in FIG. 1. FIG. 1 illustrates a current steering structure 100 that may be implemented within a current steering digital-to-analog converter (DAC) circuit. The current steering structure 100 includes a controller 130 and a plurality of current cells 101 corresponding to a number of bits of a digital input signal. For example, current steering structure 100 may include 128 current cells 101 in the case of a 7-bit digital input signal (e.g., such as one or more digital input signals basp, casp, casn, and/or basn). Each current cell 101 includes current source 105 and current source 110, and a plurality of switches 120. Current source 105 and 110 provide a differential output current signal pair including a positive current signal 140 and a negative current signal 150 to an amplifier circuit 125. The differential output current signal pair is switched using the plurality of switches 120 to provide positive current signal 140 to a non-inverting input terminal (+) and negative current signal 150 to an inverting input terminal (−) of amplifier circuit 125. Amplifier circuit 125 may include amplifier 123 with feedback resistor 122 connected from amplifier output 123A to non-inverting input (+) and feedback resistor 124 connected from amplifier output 123B to inverting input (−).

Current source 105 includes two PMOS transistors, 102 and 104, configured to provide positive current signal 140 to the plurality of switches 120. The two PMOS transistors, 102 and 104, are coupled in series. A source terminal of PMOS transistor 102 is coupled to a voltage source VDD. A drain terminal of PMOS transistor 104 is coupled to a first plurality of the switches 117. Current source 110 includes two negative-channel metal-oxide semiconductor (NMOS) transistors, 112 and 114, configured to provide negative current signal 150 to the plurality of switches 120. The two NMOS transistors, 112 and 114, are coupled in series. A source terminal of NMOS transistor 114 is connected to ground signal 115. A drain terminal of NMOS transistor 112 is connected to a second plurality of the switches 119.

When a digital input is applied to the current steering structure 100, the current steering structure 100 selects currents to be applied from the 128 current cells 101. For example, positive current signal 140 generated by current source 105 may be switched to the non-inverting (+) input terminal of amplifier circuit 125 using a switch of a first plurality of the switches 117. Similarly, negative current signal 150 generated by current source 110 may be switched to the inverting (−) input terminal of amplifier circuit 125 using a switch of a second plurality of the switches 119. Positive current signal 140 from each of active current cells 101 is summed at non-inverting input terminal (+) of amplifier circuit 125 and negative current signal 150 from each of active current cells 101 is summed at inverting input terminal (−) of amplifier circuit 125. Current sources 105 and 110 of current cell 101 not used are connected to ground signal 115 using switches 117 and 119. For example, for each current cell 101, an output capacitance of the current source 105 and an output capacitance of the current source 110 may be different. Depending on the number of current sources 105 (N1) and the number of current sources 110 (N2) used to create positive current signal 140 output, an equivalent number of current sources 110 (N1) and current sources 105 (N2) may be used to create negative current signal 150 output, and the capacitance difference seen at amplifier 123 non-inverting input terminal (+) and inverting input terminal (−) will be signal dependent. In this regard, a total capacitance at amplifier 123 non-inverting input terminal (+) may be N1 times the capacitance of current source 105 plus N2 times the capacitance of current source 110, and total capacitance at amplifier 123 inverting input terminal (−) may be N1 times the capacitance of current source 110 plus N2 times the capacitance of current source 105.

Differences in these capacitances may cause unwanted signal distortion and noise. Accordingly, there is a need to make the output capacitance of current source 105 and current source 110 equal to maintain highly linear operation of the current steering structure 100.

Figure 2:
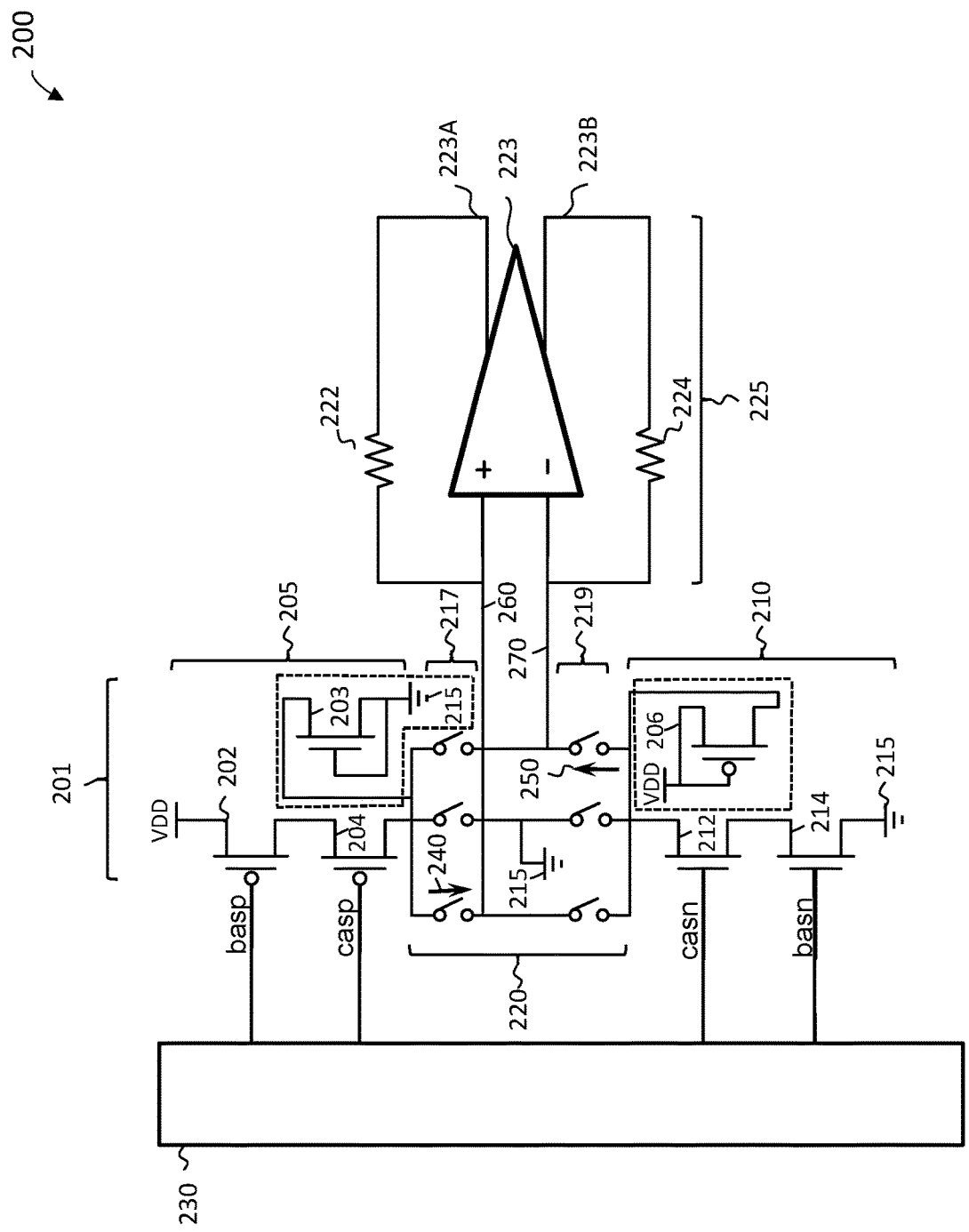
FIG. 2 illustrates an exemplary schematic diagram of a current steering structure in accordance with an embodiment of the disclosure.

An example current steering structure 200 including a current cell 201 connected to a controller circuit 230 at an input and connected to an amplifier circuit 225 at an output is shown in FIG. 2. In one embodiment, a current cell 201 of the present disclosure includes two current sources 205 and 210 configured to generate a differential current signal pair comprising positive current signal 240 and negative current signal 250. Two capacitor compensation devices, a first capacitor compensation device 203 and a second capacitor compensation device 206 are included in current sources 205 and 210, respectively. First capacitor compensation device 203 is used to compensate for an output capacitance associated with current source 210 and second capacitor compensation device 206 is used to compensate for an output capacitance associated with current source 205. Switches 220 are provided to switch positive current signal 240 and negative current signal 250 to complementary inputs of amplifier circuit 225. Amplifier circuit 225 performs further processing to provide an amplified audio signal to a headphone or a speaker (not shown).

In the illustrated embodiment, it will be understood current steering structure 200 includes a plurality of current cells 201 where each current cell 201 includes a current source 205 and a current source 210 to provide a positive current signal 240 (e.g., a first current signal) and a negative current signal 250 (e.g., a second current signal), both of which are switched using the plurality of switches 220 to provide positive current signal 240 to a non-inverting input terminal (+) and negative current signal 250 to an inverting input terminal (−) (e.g., complementary inputs) of amplifier circuit 225. The number of current cells 201 that form part of current steering structure 200 corresponds to a number of bits of a digital input signal (e.g., such as one or more digital input signals basp, casp, casn, and/or basn). For example, current steering structure 200 may include 128 current cells 201 in the case of a 7-bit digital input signal. The summed positive current signal provided to non-inverting input terminal of amplifier circuit 225 (+) is the sum of positive current signal 240 values from current source 205 of each of current cells 201. The summed negative current signal provided to inverting input terminal (−) of amplifier circuit 225 is the sum of negative current signal 250 values from current source 210 of each of current cells 201. Current cell 201 supports high dynamic range by using three output states, positive current signal 240, negative current signal 250, and no current signal.

A first current source output capacitance (not shown) may be associated with current source 205 of current cell 201. The first current source output capacitance may be a first capacitance value that is associated with a transistor structure of current source 205. A second current source output capacitance (not shown) may be associated with current source 210 of current cell 201. The second current source output capacitance may be a second capacitance value that is associated with a transistor structure of current source 210 and different than the first current source output capacitance value. In some embodiments, the first current source output capacitance value is greater than the second current source output capacitance value. In other embodiments, the first current source output capacitance value is less than the second current source output capacitance value. Differences in first and second current source output capacitance results in unwanted signal distortion and noise that may affect performance of current cell 201.

Current cell 201 includes a first capacitor compensation device 203 connected to an output 260 of current source 205 to provide a capacitance value to compensate for second current source output capacitance. Current cell 201 includes a second capacitor compensation device 206 connected to an output 270 of current source 210 to provide a capacitance value to compensate for first current source output capacitance. In some embodiments, a sum of first current source output capacitance and first capacitor compensation device 203 is approximately equal to a sum of second current source output capacitance and second capacitor compensation device 206.

In one example, current source 205 includes two positive-channel metal-oxide semiconductor (PMOS) transistors, 202 and 204, configured to provide positive current signal 240 (e.g., first current signal) to the plurality of switches 220. In various examples, the two PMOS transistors, 202 and 204, may be PMOS transistors coupled in series. It is understood, that in other examples, current source 205 may comprise more than two PMOS transistor devices coupled in series. A source terminal of PMOS transistor 202 (e.g., first PMOS transistor) is coupled to a voltage source VDD. A drain terminal of PMOS transistor 204 (e.g., second PMOS transistor) is coupled to a first plurality of the switches 217.

Second capacitor compensation device 206 includes a PMOS transistor substantially similar to PMOS transistor 204 of current source 205. In this regard, substrate materials, manufacturing processes, and electrical performance parameters of second capacitor compensation device 206 are similar to PMOS transistor 204. Gate terminal and source terminal of second capacitor compensation device 206 are connected to voltage source VDD. A drain terminal of second capacitor compensation device 206 is connected to the second plurality of the switches 219 and provides a capacitance value at output 270 of current source 210.

In one example, current source 210 includes two NMOS transistors, 212 and 214, configured to provide negative current signal 250 (e.g., second current signal) to the plurality of switches 220. In various examples, the two NMOS transistors, 212 and 214, may be NMOS transistors coupled in series. It is understood, that in other examples, current source 210 may comprise more than two NMOS transistor devices coupled in series. A source terminal of NMOS transistor 214 (e.g., first NMOS transistor) is connected to ground signal 215. A drain terminal of NMOS transistor 212 (e.g., second NMOS transistor 212) is connected to a second plurality of the switches 219. In some examples, current source 210 is identified as a current sink. It will be appreciated that, in some examples, current source 205 may comprise NMOS transistor devices and current source 210 may comprise PMOS transistor devices.

First capacitor compensation device 203 includes an NMOS transistor substantially similar to NMOS transistor 212 of current source 210. In this regard, substrate materials, manufacturing processes, and electrical performance parameters of first capacitor compensation device 203 are similar to NMOS transistor 212. A gate terminal and source terminal of first capacitor compensation device 203 are connected to ground signal 215. A drain terminal is connected to the first plurality of the switches 217 and provides a capacitance value at output 260 of current source 205.

Current steering structure 200 includes a controller circuit 230 that is configured to selectively turn on and turn off current sources 205 and 210 in each current cell 201. Controller circuit 230 operates to control first plurality of the switches 217 to selectively couple positive current signal 240 (e.g., first current signal) to non-inverting input terminal (+) (e.g., positive input signal terminal) of amplifier circuit 225. Controller circuit 230 operates to control second plurality of the switches 219 to selectively couple negative current signal 250 (e.g., second current signal) to an inverting input terminal (−) (e.g., negative input signal terminal) of amplifier circuit 225. In some embodiments, amplifier circuit 225 receives positive current signal 240 (e.g., first current signal) at the non-inverting input terminal (+) (e.g., positive input signal terminal) and converts the positive current signal 240 to a positive voltage signal (e.g., a first voltage signal). Amplifier circuit 225 receives negative current signal 250 (e.g., second current signal) at the inverting input terminal (−) (e.g., negative input signal terminal) and converts the negative current signal to a negative voltage signal (e.g., a second voltage signal). In some embodiments, amplifier circuit 225 may include amplifier 223 with feedback resistor 222 connected between amplifier output 223A and non-inverting input (+), and feedback resistor 224 connected between amplifier output 223B and inverting input (−).

In some embodiments, current sources 205 and 210 of current cell 201 may be connected to a static signal that is configured to provide a current path to a common voltage at the input terminals (e.g., non-inverting input terminal (+) and inverting input terminal (−)) of amplifier circuit 225. In this regard, one of switches 217 connects drain terminal of PMOS transistor 204 to ground signal 215 and one of switches 219 connects drain terminal of NMOS transistor 212 to ground signal 215 to provide a current path to ground for the first and second current signals as a no current output state that supports a high dynamic range of current steering structure 200.

Figure 3:
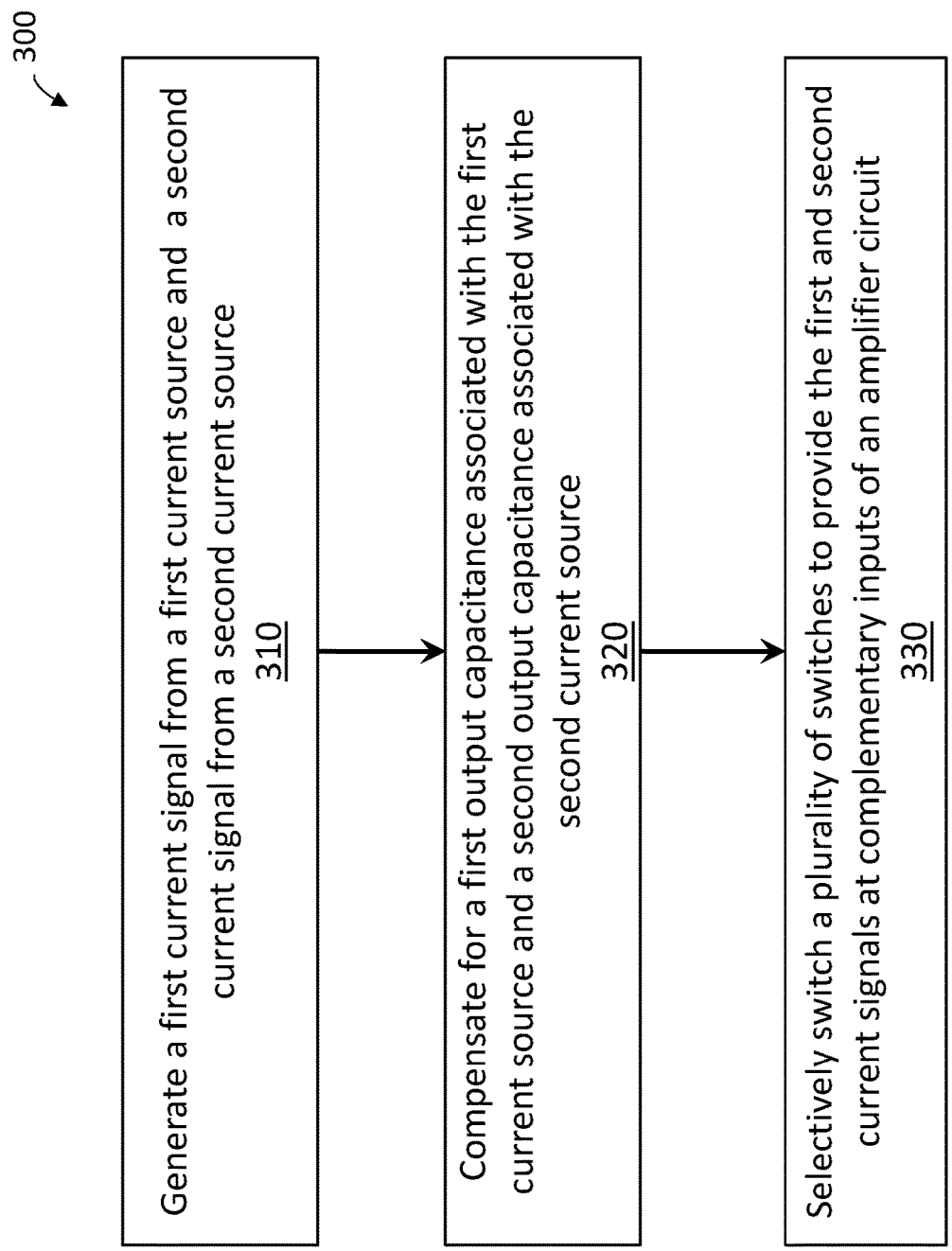
FIG. 3 is a flow chart illustrating a method for operation of a current steering structure in accordance with an embodiment of the disclosure.

FIG. 3 is a flow chart illustrating a method 300 for operation of a current steering structure 200 in accordance with an embodiment of the disclosure. Method 300 begins with operations of step 310. Operations of step 310 may be performed, for example, by current source 205 and current source 210 of current cell 201. Operations of step 310 includes generating a positive current signal 240 (e.g., first current signal) from current source 205. Operations of step 310 further includes generating a negative current signal 250 (e.g., second current signal) from current source 210. In some embodiments, current cell 201 is inactive, and current source 205 and current source 210 are grounded at ground signal 215 by first plurality of the switches 217 and second plurality of the switches 219. In this regard, current steering structure 200 provides for a high dynamic operating range by utilizing a three state output of positive current, negative current, and zero current.

Method 300 may further include operations (step 320) of compensating for first current source output capacitance associated with current source 205 (e.g., first current source) and second current source output capacitance associated with current source 210 (e.g., second current source) of current cell 201. In this regard, a first capacitor compensation device 203 is included at an output of current source 205 to compensate for the second current source output capacitance associated with current source 210. A second capacitor compensation device 206 is included at an output of current source 210 to compensate for the first current source output capacitance associated with current source 205. For example, first capacitor compensation device 203 and second capacitor compensation device 206 provide for a substantially equal first and second current source output capacitance of current cell 201.

Method 300 may further include operations (step 330) of switching positive current signal 240 and negative current signal 250 to a differential input pair of amplifier circuit 225. In some embodiments, amplifier circuit 225 performs further processing to convert the current signals to voltage signals and provide an amplified audio signal to a headphone or an internal speaker of a device such as a laptop computer, a computer tablet, an MP3 player, and/or a smart phone, for example.

Where applicable, various embodiments provided by the present disclosure may be implemented using hardware, software, or combinations of hardware and software. Also, where applicable, the various hardware components and/or software components set forth herein may be combined into composite components comprising software, hardware, and/or both without departing from the spirit of the present disclosure. Where applicable, the various hardware components and/or software components set forth herein may be separated into sub-components comprising software, hardware, or both without departing from the scope of the present disclosure. In addition, where applicable, it is contemplated that software components may be implemented as hardware components and vice-versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A current cell comprising:
a first current source configured to provide a first current signal, the first current source having a first current source output capacitance value;
a second current source configured to provide a second current signal, the second current source having a second current source output capacitance value different from the first current source output capacitance value;
a plurality of switches coupled between the first and second current sources configured to switch the first and second current signals; and
wherein the first current source comprises a first capacitor compensation device coupled to an output of the first current source configured to provide a capacitance value to compensate for the second current source output capacitance, and wherein the second current source comprises a second capacitor compensation device coupled to an output of the second current source configured to provide a capacitance value to compensate for the first current source output capacitance, wherein a sum of the first current source output capacitance and the capacitance provided by the first capacitor compensation device is approximately equal to a sum of the second current source output capacitance and the capacitance provided by the second capacitor compensation device.

2. The current cell of claim 1, wherein the first current source comprises two PMOS transistors operable to provide the first current signal to the plurality of switches, the two PMOS transistors comprising a first and a second PMOS transistor coupled in series, wherein a source terminal of the first PMOS transistor is coupled to a voltage source and a drain terminal of the second PMOS transistor is coupled to a first plurality of the switches.

3. The current cell of claim 2, wherein the second capacitor compensation device comprises a PMOS transistor substantially similar to the PMOS transistors of the first current source, wherein a gate and source terminal of the second capacitor compensation device are coupled to the voltage source, and a drain terminal is coupled to the second plurality of the switches and operable to provide the capacitance value at the output of the second current source.

4. The current cell of claim 1, wherein the second current source comprises two NMOS transistors operable to provide the second current signal to the plurality of switches, the two NMOS transistors comprising a first and a second NMOS transistor coupled in series, wherein a source terminal of the first NMOS transistor is coupled to a ground signal and a drain terminal of the second NMOS transistor is coupled to a second plurality of the switches.

5. The current cell of claim 4, wherein the first capacitor compensation device comprises an NMOS transistor substantially similar to the NMOS transistors of the second current source, wherein a gate and a source terminal of the first capacitor compensation device are coupled to the ground signal, and a drain terminal is coupled to the first plurality of the switches and operable to provide the capacitance value at the output of the first current source.

6. The current cell of claim 1, further comprising a controller circuit configured to selectively turn on and turn off the first and second current sources.

7. The current cell of claim 6, further comprising an amplifier circuit comprising a positive input signal terminal coupled to a first plurality of the switches and a negative input signal terminal coupled to a second plurality of the switches, wherein the controller circuit is configured to control the first and second plurality of the switches to selectively couple the first current signal to the positive input signal terminal and selectively couple the second current signal to the negative input signal terminal.

8. The current cell of claim 7, wherein the amplifier circuit is configured to convert the first current signal to a first voltage signal at the positive input signal terminal and convert the second current signal to a second voltage signal at the negative input signal terminal.

9. The current cell of claim 1, further comprising a static signal operable to provide a current path to a common voltage, wherein the plurality of switches coupled between the first and second current sources is configured to switch the first and second current signals to a ground signal to provide a zero first and second current signal.

10. The current cell of claim 1, further configured as one of a plurality of current cells of a digital to analog converter; and
wherein the first capacitor compensation device and the second capacitor compensation device are configured to provide continuous capacitance compensation during operation of the digital to analog converter.

11. A method of using the current cell of claim 1, the method comprising:
generating the first current signal using the first current source;
generating the second current signal using the second current source;
compensating for the first current source output capacitance using the second capacitor compensation device;
compensating for the second current source output capacitance using the first capacitor compensation device; and
selectively switching the first and second current signals.

12. A method comprising:
generating a first current signal from a first current source, the first current source having a first current source output capacitance and comprising a first capacitor compensation device coupled to an output of the second current source;
generating a second current signal from a second current source, the second current source having a second current source output capacitance and comprising a second capacitor compensation device coupled to an output of the first current source;
compensating for the first current source output capacitance using the second capacitor compensation device;
compensating for the second current source output capacitance using the first capacitor compensation device, wherein a sum of the first current source output capacitance and the first capacitor compensation device is approximately equal to a sum of the second current source output capacitance and the second capacitor compensation device; and
selectively switching a plurality of switches to provide the first current signal and the second current signal at complementary inputs of an amplifier circuit.

13. The method of claim 12, wherein the first current source provides the first current signal to the plurality of switches, the first current source comprising a first and a second PMOS transistor coupled in series, wherein a source terminal of the first PMOS transistor is coupled to a voltage source and a drain terminal of the second PMOS transistor is coupled to a first plurality of the switches.

14. The method of claim 13, wherein the compensating for the first current source output capacitance comprises providing a capacitance value at the output of the second current source by a second capacitor compensation device, wherein the second capacitor compensation device comprises a PMOS transistor substantially similar to the PMOS transistors of the first current source.

15. The method of claim 12, wherein the second current source provides the second current signal to the plurality of switches, the second current source comprising a first and a second NMOS transistor coupled in series, wherein a source terminal of the first NMOS transistor is coupled to a ground signal and a drain terminal of the second NMOS transistor is coupled to a second plurality of the switches.

16. The method of claim 15, wherein the compensating for the second current source output capacitance comprises providing a capacitance value at the output of the first current source by a first capacitor compensation device, wherein the first capacitor compensation device comprises an NMOS transistor substantially similar to the NMOS transistors of the second current source.

17. The method of claim 12, further comprising controlling each of the first and second current sources to selectively turn on and turn off the first and second current sources;
wherein compensating for the first current source output capacitance using the second capacitor compensation device and compensating for the second current source output capacitance using the first capacitor compensation device further comprises providing continuous capacitance compensation during operation.

18. The method of claim 12, further comprising controlling a first and a second plurality of the switches to selectively couple the first current signal to a positive input signal terminal and selectively couple the second current signal to a negative input signal terminal of an amplifier circuit.

19. The method of claim 18, further comprising converting the first current signal to a first voltage signal at the positive input signal terminal and converting the second current signal to a second voltage signal at the negative input signal terminal.

20. The method of claim 12, further comprising selectively switching the plurality of switches to a ground signal to provide a zero first and second current signal.

* * * * *